United States Patent
Hesse

(10) Patent No.: US 10,512,188 B2
(45) Date of Patent: Dec. 17, 2019

(54) LINE, ARRANGEMENT AND SERVER INSERT

(71) Applicant: FUJITSU LIMITED, Kawasaki-shi, Kanagawa (JP)

(72) Inventor: Ronny Hesse, München (DE)

(73) Assignee: FUJITSU LIMITED, Kawasaki (JP)

( * ) Notice: Subject to any disclaimer, the term of this patent is extended or adjusted under 35 U.S.C. 154(b) by 114 days.

(21) Appl. No.: 15/585,798

(22) Filed: May 3, 2017

(65) Prior Publication Data

US 2017/0325351 A1 Nov. 9, 2017

(30) Foreign Application Priority Data

May 4, 2016 (DE) .................. 10 2016 108 323

(51) Int. Cl.
*H05K 7/14* (2006.01)
*H05K 7/20* (2006.01)

(52) U.S. Cl.
CPC ......... *H05K 7/1487* (2013.01); *H05K 7/1489* (2013.01); *H05K 7/1492* (2013.01); *H05K 7/20736* (2013.01)

(58) Field of Classification Search
CPC .. H05K 7/1487; H05K 7/1489; H05K 7/1492; H05K 7/20736
See application file for complete search history.

(56) References Cited

U.S. PATENT DOCUMENTS

| 5,166,867 | A | 11/1992 | Seyama et al. | |
|---|---|---|---|---|
| 6,205,029 | B1 * | 3/2001 | Byrne | H05K 7/1457 174/68.2 |
| 9,326,416 | B1 * | 4/2016 | Xu | G11B 33/128 |
| 9,723,744 | B1 * | 8/2017 | Fricker | H05K 7/1492 |
| 2013/0107436 | A1 * | 5/2013 | Li | G06F 1/188 361/679.4 |
| 2013/0235531 | A1 | 9/2013 | Toda et al. | |
| 2014/0113473 | A1 * | 4/2014 | Ehlen | H05K 7/1489 439/251 |

(Continued)

FOREIGN PATENT DOCUMENTS

| DE | 102009018945 | 10/2010 |
|---|---|---|
| DE | 102015207128 | 10/2015 |

OTHER PUBLICATIONS

Great Britain Search Report dated Oct. 31, 2017 for corresponding Great Britain Patent Application No. 1707151.5, 3 pages.

*Primary Examiner* — James Wu
*Assistant Examiner* — Hung Q Dang
(74) *Attorney, Agent, or Firm* — Fujitsu Patent Center

(57) ABSTRACT

The invention relates to a line for a server insert for connecting a power supply unit with a circuit board with distributor contacts. The line comprises a first current rail and a second current rail. The first current rail and the second current rail are arranged parallel to each other. Both current rails can be secured at connections of a power supply unit of a server insert and a circuit board with distributor contacts. The current rails have first connection elements, which are arranged in such a way that two lines can be connected with each other in order to form a point-symmetrical arrangement of lines.

The invention further relates to an arrangement and a server insert.

17 Claims, 4 Drawing Sheets

(56) References Cited

U.S. PATENT DOCUMENTS

2014/0308828 A1\* 10/2014 Ehlen ..................... H01R 25/14
                                                        439/110
2015/0302954 A1  10/2015 Hara et al.
2016/0316939 A1\* 11/2016 Kraiss .................... A47F 5/103

\* cited by examiner

LINE, ARRANGEMENT AND SERVER INSERT

The invention relates to a line for a server insert, to an arrangement, and to a server insert.

In server systems, such as for example rack servers, server inserts are used for accommodating components in the server system. A server insert comprises for example one or more servers or components of a server. If multiple components are accommodated in one server insert, a supply of energy to the individual components must be ensured.

It is the object of the invention to describe a line, an arrangement and a server insert which permit an advantageous supply of energy.

According to a first aspect, the object is achieved by means of a line for a server insert for connecting a power supply unit to a circuit board with distributor contacts. The line comprises a first current rail and a second current rail. The first current rail and the second current rail are arranged parallel to each other. The first current rail and the second current rail can be secured on a power supply unit of a server insert and a circuit board with distributor contacts. The current rails have first connection elements, which are arranged in such a way that two lines can be connected to each other to form a point-symmetrical arrangement of lines.

Current rails have a compact structure and can be of flat form. The lines comprise current rails. The current rails have the advantage that they are of flat form. In this way, they take up little structural space. At the same time, current rails permit transmission of high levels of power; in particular, high currents can be transmitted. Through the use of current rails which are arranged parallel to each other, space can be saved in a server insert in relation to other solutions. The line has first connection elements which permit a point-symmetrical arrangement of two lines. The first connection elements are for example lugs. The first connection elements can be easily connected to one another by means of an adapter piece, for example by virtue of the adapter piece being screwed or plugged onto the first connection elements. Since the lines can be arranged in a point-symmetrical manner, it is possible for two identical lines to be connected to each other, to form a flexible energy supply concept, such that said lines can conduct energy from different sides in a server insert to a central point, the point of symmetry. In particular, one manufacturing tool is sufficient for manufacturing an arrangement composed of multiple current rails, because current rails in each case of identical design can be connected in a point-symmetrical manner. The symmetrical arrangement permits space-saving accommodation in a server, and thus a high component density in the server.

In one advantageous refinement, the current rails have second connection elements, by means of which the current rails can be secured on the circuit board with distributor contacts.

By means of the second connection elements, a connection between the current rails and the circuit board can be realized. It is thus possible for the power that is transmitted via the line to be made available on the circuit board, and via the distributor contacts of the circuit board, for components of a server insert. Also, in this way, the circuit board can be connected to the line with a mechanical holding action, such that the circuit board is held mechanically on the line.

According to a second aspect of the invention, the object is achieved by means of an arrangement comprising two lines of the type described above. The two lines are interconnected by means of the first connection elements and are arranged in a point-symmetrical manner. The arrangement furthermore has at least one power supply unit which is mechanically and electrically connected to one of the lines. The arrangement moreover comprises two circuit boards with distributor contacts, the two lines being mechanically and electrically connected to in each case one of the circuit boards.

The arrangement of the two lines can make energy from the at least one power supply unit available on the circuit boards with the distributor contacts. The power supply units may be power adapters, so-called power supply units (PSU). Since the lines are in each case mechanically and electrically connected to one of the circuit boards and electrically interconnected, it is sufficient for a power supply unit to be connected to one line of the point-symmetrical arrangement of lines, in order to make energy available on both circuit boards with distributor contacts.

In an advantageous refinement, the arrangement comprises multiple power supply units, each of which is mechanically and electrically connected to one of the lines.

If power supply units are connected to both lines, the arrangement is made more fail-safe. If one of the power supply units fails, the other can make energy available on both circuit boards with distributor contacts. For example, in each case two power supply units are connected to the lines, such that a total of four power supply units are connected to the arrangement. It is self-evidently also possible for a different number of power supply units to be connected to such an arrangement.

In a further advantageous refinement, each of the circuit boards is set up to supply two components of a server insert with power. Here, a supply can be provided to all components by one and/or multiple power supply units by means of the two lines.

Owing to the point-symmetrical arrangement of the lines, the two circuit boards with distributor contacts are connected to one or more, in particular two or four, power supply units, regardless of which of the lines the power supply units are connected to. The power supply units are advantageously dimensioned such that one power supply unit can supply power to all components which are connected to the circuit boards with distributor contacts. The components may be logically independent processing units, so-called "nodes", which act as a separate server.

In one advantageous refinement, the power supply units each belong to one of the circuit boards. The power supply units are in this case set up to supply power to components connected via the lines and the associated circuit board to the circuit board and, in the alternative, additionally to components connected to the other circuit board.

If the arrangement comprises two circuit boards with distributor contacts, to which a total of four components are connected, each power supply unit is correspondingly dimensioned so as to be overdimensioned at least fourfold with respect to one component. For example, a power supply unit outputs up to 2000 W. One of the components consumes for example 300 W at 12 V. Thus, it is possible for one power supply unit to supply energy to all four components and to further assemblies.

In a further advantageous refinement, the two circuit boards are spaced apart in such a way as to allow an assembly of the server insert to be arranged between the two circuit boards.

In the arrangement described above, the current rails are advantageously led along close to housing sides and close to the base of the server insert. In particular, the first current rail and the second current rail are arranged parallel to a housing side situated closest to the current rails. Thus, structural space is left free between the current rails and that housing side which is situated opposite the housing side closest to the current rails. An assembly can be arranged in said structural space. The two circuit boards of the two lines according to the arrangement described above are spaced apart from one another to such an extent that an assembly can be arranged between the circuit boards and above the lines.

In an advantageous refinement, the assembly comprises fans for the server insert. The fans can be supplied with energy via further contacts on the circuit boards.

The circuit boards according to the arrangement described above may have further contacts. The abovementioned assembly, or the fans, can be connected to the further contacts, for example via cables. Thus, via the circuit boards, said additional components are also supplied with energy in addition to the other discussed components which are connected to the distributor contacts of the circuit boards.

According to a third aspect, the object is achieved by means of a server insert having an arrangement of the type described above.

A server insert of said type preferably comprises a fully symmetrical distribution of the components. Said components are advantageously arranged, in accordance with the arrangement described above, in a point-symmetrical manner about the same point as the lines.

The invention will be described in more detail below on the basis of figures and exemplary embodiments. In the figures:

FIGS. 1 to 5 show various parts and arrangements of an exemplary embodiment of the invention. Here, identical components are denoted by the same reference designations.

Figure 1:
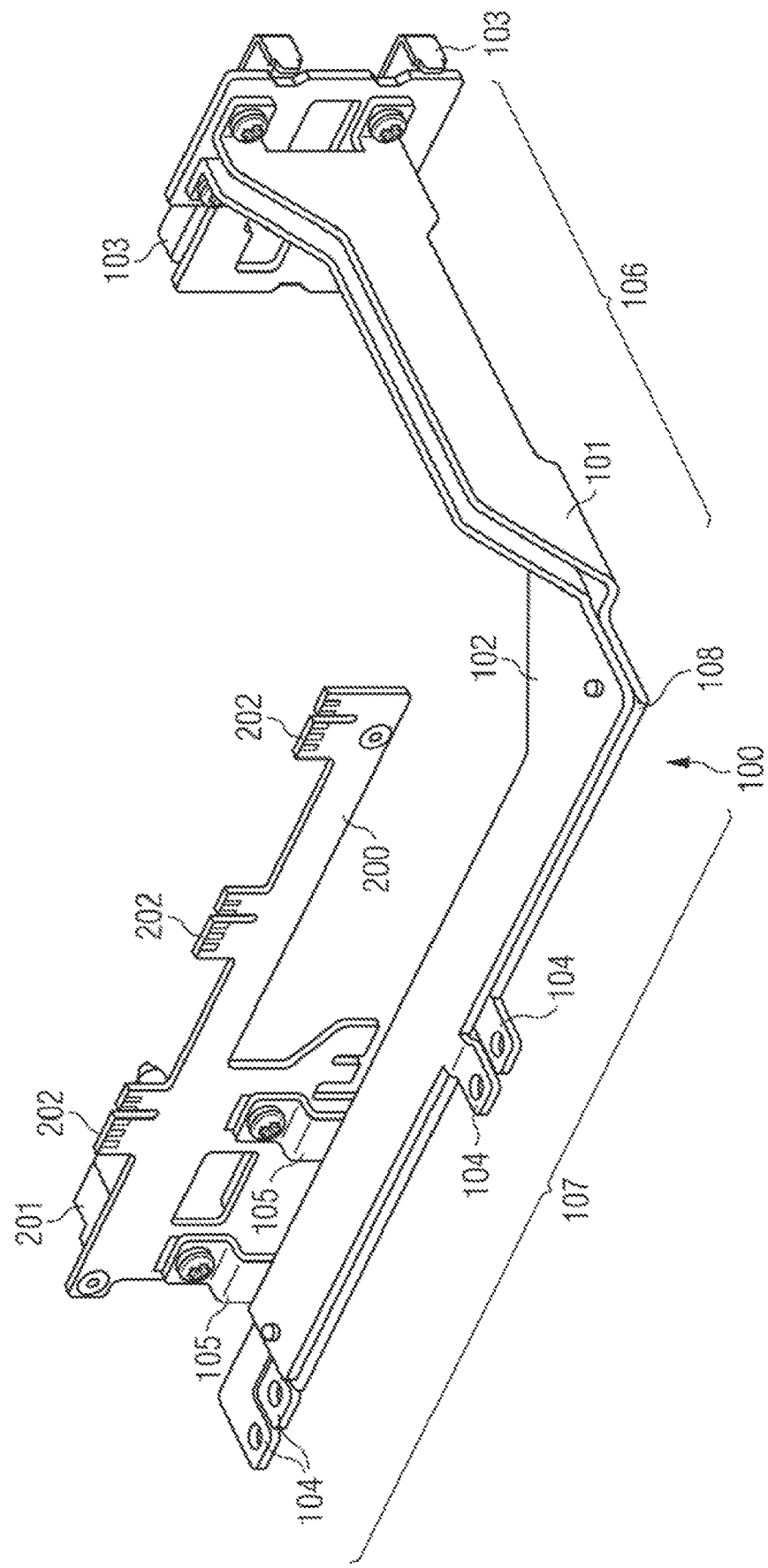
FIG. 1 shows a line with a circuit board according to an exemplary embodiment.

FIG. 1 shows a line 100 with a circuit board 200. The line 100 has a first current rail 101 and a second current rail 102. The first current rail 101 and the second current rail 102 run parallel to each other. In each case two plug connectors 103 are connected to the first current rail 101 and to the second current rail 102, which plug connectors are each connectable to a power supply unit. In further refinements, one or more than two plug connectors 103 are connected to the two current rails 101, 102, which plug connectors are each connectable to a power supply unit.

Both the first current rail 101 and the second current rail 102 have first connection elements 104. Multiple lines 100 can be coupled to one another by means of the first connection elements 104. Two lines 100 coupled by means of the first connection elements 104 form a point-symmetrical arrangement.

The line 100 furthermore has second connection elements 105 which establish electrical contact between the first current rail 101 and the circuit board 200 and electrical contact between the second current rail 102 and the circuit board 200. In the exemplary embodiment shown, the second connection elements 105 additionally serve for mechanical coupling of the first current rail 101 and of the second current rail 102 to the circuit board 200. The circuit board 200 is thus fixed by means of the second connection elements 104 to the first current rail 101 and to the second current rail 102. In an alternative exemplary embodiment, the mechanical coupling of the circuit board 200 to the first current rail 101 and/or to the second current rail 102 may be produced, without screws, by means of an additional plug connector or connector.

The two current rails 101, 102 are composed of a conductive material and are of band-like form. In the exemplary embodiment shown, the first current rail 101 and the second current rail 102 are composed of a metal sheet in strip form, which is bent such that a first region 106 and a second region 107 are formed. In the first region 106, the two current rails 101, 102 are arranged in an upright configuration. In the second region 107, the two current rails 101, 102 are arranged so as to be bent through 90° in relation to the orientation of the first region 106. That is to say, a plane of extent of the two current rails 101, 102 in the first region 106 runs perpendicular to a plane of extent of the two current rails 101, 102 in the second region. In the exemplary embodiment, the two current rails 101, 102 are bent through 90° in each of two dimensions, such that both the orientation of the plane of extent and also the direction of extent along the two current rails 101, 102 change from the first region 106 to the second region 107. Owing to the bend of the two current rails 101, 102, the line 100 can be arranged in space-saving fashion in a server housing. For example, the first region 106 is led along a vertical side wall of the server housing and the second region 107 is led along a bottom side (that is to say on the base) of the server housing. The metal sheet is generally adapted for currents to be transmitted, and dimensioned at least so as to withstand the powers transmitted. In the exemplary embodiment, the current rails 101, 102 have a thickness of 2.3 mm.

The first current rail 101 and the second current rail 102 are spaced apart from one another by an insulation 108. A supply voltage of 12 V prevails at the first current rail 101. The second current rail 102 serves as a ground contact. The insulation 108 ensures that no short circuits occur between the first current rail 101 and the second current rail 102.

Both the first connection elements 104 and the second connection elements 105 are, in the embodiment shown, in the form of lugs which project from the first current rail 101 and from the second current rail 102 respectively. The first connection elements 104 and the second connection elements 105 have holes by means of which a screw connection can be produced. In an alternative embodiment, a plug connection is used instead of a screw connection.

In an alternative embodiment, it may be provided that both the first connection elements 104 and the second connection elements 105 are part of the first or second current rail 101, 102, that is to say do not project from the strip-like form of the respective current rail 101, 102. In this case, the first connection elements 104 and/or the second connection elements 105 are for example holes in the current rails 101, 102.

Figure 2:
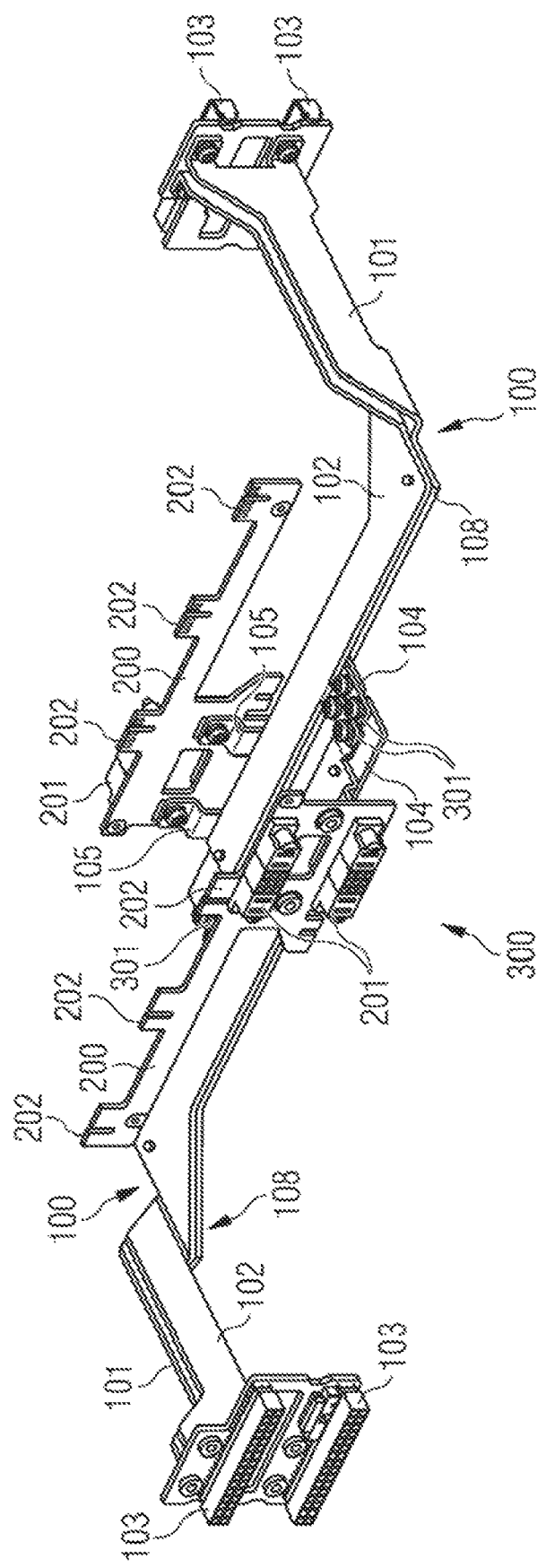
FIG. 2 shows an arrangement of two lines according to the exemplary embodiment.

FIG. 2 shows an arrangement 300 with two lines 100 and two circuit boards 200. Here, the lines 100 are connected to one another by means of their respective first connection elements 104.

Figure 3:
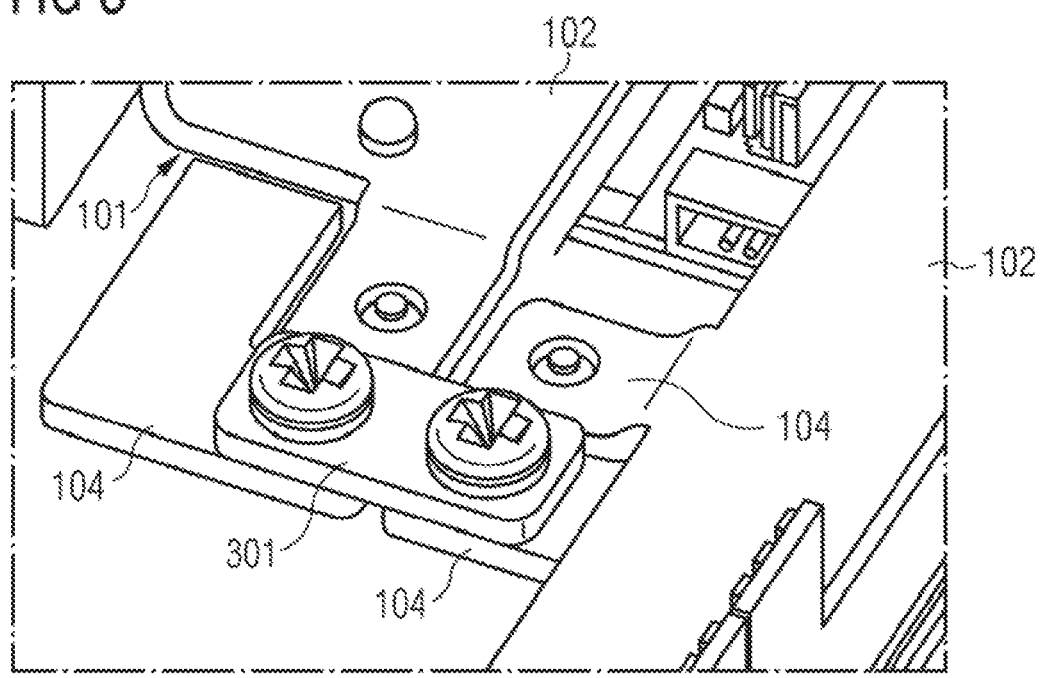
FIG. 3 shows a detail view of the arrangement from FIG. 2.
Figure 4:
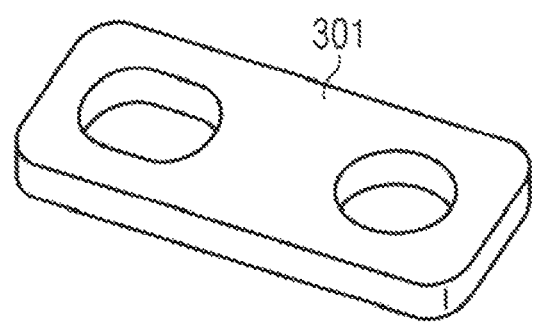
FIG. 4 shows an adapter element from the detail view from FIG. 3.

FIG. 3 shows a detailed illustration of a connection of two first connection elements 104. FIG. 4 shows an adapter element 301 which can be used for the connection shown in FIG. 3.

The connection of the two lines 100 of the arrangement 300 from FIG. 2 will now be discussed in more detail with reference to FIGS. 2 to 4.

In the arrangement 300 as per FIG. 2, the lines 100 are arranged such that in each case the first connection elements 104 of the two current rails 101, 102 of each line 100 are situated opposite one another. Two first connection elements 104 are connected to one another by means of the adapter element 301 (cf. FIG. 4). Since each current rail 101, 102 has two first connection elements 104, four adapter elements 301 are provided for connecting two lines 100. For the fixing of the adapter element 301, screws are screwed through the adapter element 301 into the first connection elements 104 of the first and second current rails 101, 102.

In FIG. 3, first connection elements 104 of the second current rail 102 are not connected to one another by means of an adapter element 301, in order to better illustrate the arrangement thereof opposite one another. To connect the lines 100, it is also possible here for an adapter element 301 as per FIG. 4 to be mounted and screwed by means of screws into the first connection elements 104.

The adapter element 301 as per FIG. 4 has two holes, each of which holes is arranged in alignment above a hole of a lug of the first connection elements 104 in FIG. 3. It is preferable for at least one hole to be a slot in order to facilitate centring of the adapter element 301 over the first connection elements 104.

In an alternative embodiment which is not shown, a plug connection is provided by means of which the first connection elements 104 of the two lines are coupled to one another. Here, use may likewise be made of the adapter element 301, or of some other adapter element. In this embodiment, all or selected screws are replaced with plug connectors.

In a further alternative embodiment, in each case two first connection elements 104 are connected by means of plug connectors which render the use of an adapter element 301 superfluous. A plug connector of said type is for example of U-shaped form.

The first connection elements 104 are arranged on the two current rails 101, 102 such that two identical lines 100 can be connected by means of the first connection elements 104 and the adapter elements 301 to form a point-symmetrical arrangement as shown in FIG. 2. Such an arrangement is suitable in particular for server inserts of symmetrical construction.

Figure 5:
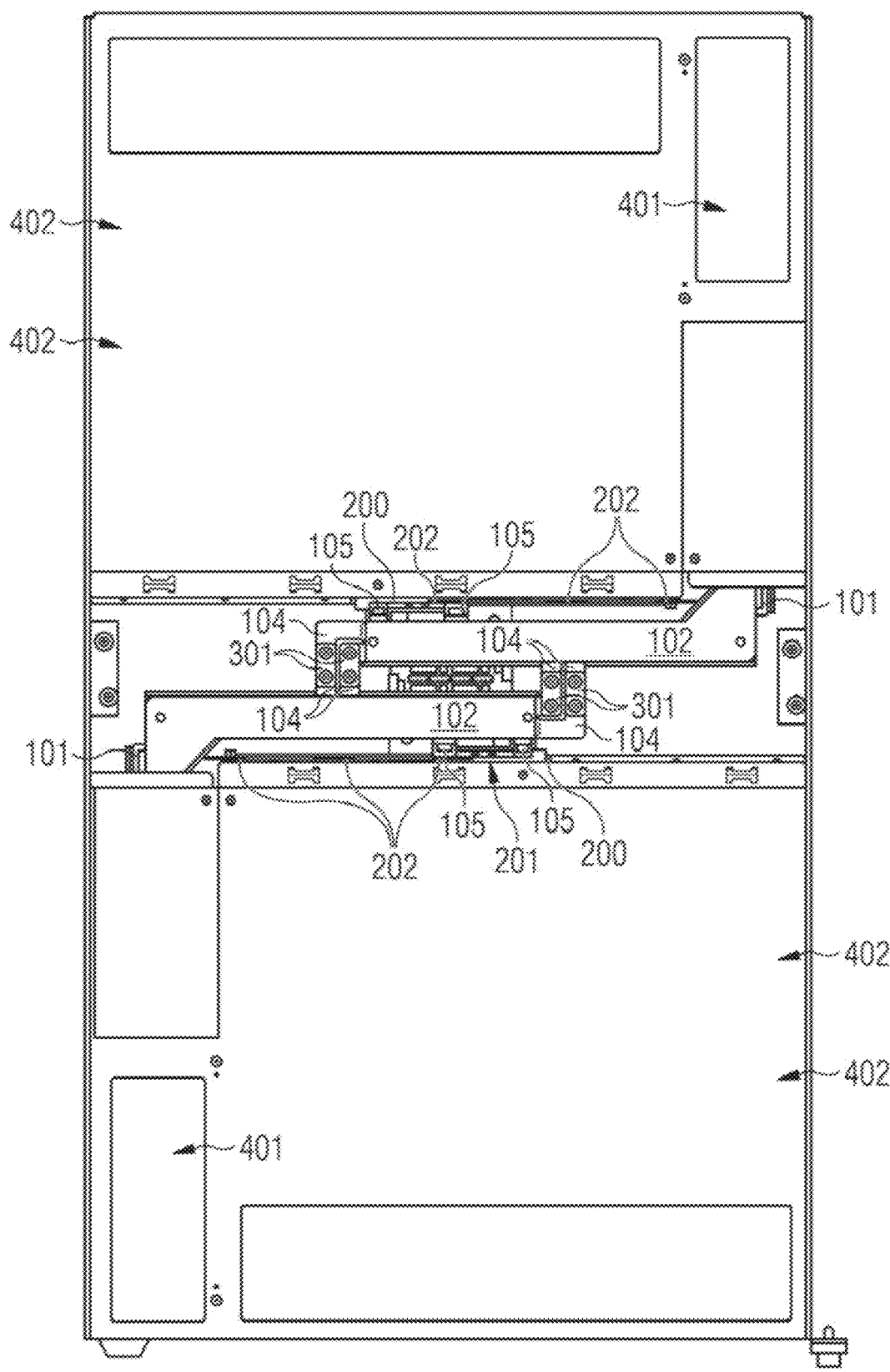
FIG. 5 shows a server module having the arrangement as per FIG. 2.

A server insert 400 of said type is illustrated in FIG. 5. The server insert 400 from FIG. 5 has four power supply units 401, of which in each case two are arranged one above the other. In other embodiments, the server insert 400 has two power supply units 401, of which in each case one is connected to one line 100. In further embodiments, it is also possible for more than a total of four power supply units 401 to be arranged in the server insert 400. In this embodiment, the lines 100 connected to the power supply units 401 are correspondingly equipped with plug connectors 103, such that one plug connector 103 is provided for each power supply unit 401.

The server insert 400 furthermore has four components 402 for the server insert 400, of which components in each case two are arranged one above the other. Owing to the plan view of the server insert 400, two cover plates 403 are visible, which are arranged symmetrically. The four components 402 and the four power supply units 401 are situated under the cover plates 403. The power supply units 401 are indicated by markings.

The circuit board 200 has distributor contacts 201. The distributor contacts 201 serve for electrically connecting the components 402 to the lines 100. The circuit board 200 furthermore has further contacts 202 (these can be seen in particular in FIGS. 1 and 2). The further contacts 202 serve for supplying energy to an assembly not shown in the figures. For this purpose, the assembly may be plugged onto the further contacts 202 of the circuit board 200 by means of cables or directly. It is thus possible for an assembly, for example a fan bank, to be inserted between the two circuit boards 200. The space for the assembly is obtained in particular owing to the bent arrangement of the individual lines 100, as described above with regard to FIG. 1.

If a fan bank, that is to say multiple fans, are inserted as an assembly into the server insert 400 between the two circuit boards 200, it is possible for all components 402 and the power supply units 401 to be cooled.

In the exemplary embodiment, the power supply units 401 are power adapters. The power adapters output in each case a power of 2000 W. The components 402 each consume a power of approximately at most 300 W. A supply voltage of 12 V is applied to the components via the lines 100. It is thus possible for each of the two power supply units 401 to supply power to all four components 402 of the server insert 400. If both power supply units 401 provide the power, the maximum power that can be drawn from the respective power supply unit 401 is correspondingly reduced. In an emergency situation, for example in the event of failure or loss of one of the power supply units 401, it is then possible for the other, second power supply unit 401 to provide the supply to the entire server insert 400.

LIST OF REFERENCE DESIGNATIONS

100 Line
101 First current rail
102 Second current rail
103 Plug connector
104 First connection element
105 Second connection element
106 First region
107 Second region
108 Insulation
200 Circuit board
201 Distributor contact
202 Further contact
300 Arrangement
301 Adapter element
400 Server insert
401 Power supply unit
402 Component
403 Cover plate

The invention claimed is:

1. A line for a server insert for connecting a power supply unit of the server insert to a circuit board with distributor contacts, the line comprises:
   a first current rail; and
   a second current rail, wherein
   the first current rail and the second current rail are arranged parallel to each other and are configured to be secured on the power supply unit of the server insert and the circuit board with distributor contacts, the current rails have first connection elements, which are arranged in such a way that the line is connectable with another line to form a point-symmetrical arrangement of the line and the other line,
   at least one plug connector is connected to the first current rail and at least one plug connector is connected to the second current rail, and
   the plug connectors are each connectable to the power supply unit of the server insert.

2. The line according to claim 1, wherein the current rails have second connection elements, which are configured such that the current rails are securable with the second connection elements on the circuit board with the distributor contacts.

3. An arrangement comprising
two lines for a server insert for connecting a power supply unit of the server insert to a circuit board,
wherein each of the two lines comprises a first current rail and a second current rail, wherein on each of the two lines the first current rail and the second current rail are arranged parallel to each other and are configured to be secured on the power supply unit of the server insert and the circuit board,
wherein the current rails have first connection elements, which are arranged in such a way that the two lines are connectable with each other to form a point-symmetrical arrangement of the two lines, and
wherein the two lines are interconnected with the first connection elements and are arranged in a point-symmetrical manner, and wherein on each of the two lines at least one plug connector is connected to the first current rail and at least one plug connector is connected to the second current rail, wherein the plug connecters are each connectable to the power supply unit of the server insert,
the at least one power supply unit of the server insert, which is mechanically and electrically connected to one of the two lines, and
two circuit boards including the circuit board and another circuit board, the two circuit boards having distributor contacts, and each of the two lines being mechanically and electrically connected with one of the two circuit board.

4. The arrangement according to claim 3, wherein the current rails have second connection elements, and the current rails are secured with the second connection elements on the respective circuit boards with the distributor contacts.

5. The arrangement according to claim 3, comprising at least two of the power supply units of the server insert, each of which is mechanically and electrically connected to one of the lines.

6. The arrangement according to claim 3, wherein each of the circuit boards is set up to supply two components of the server insert with power and wherein all components are configured to be supplied by one or more of the power supply units of the server insert by means of both lines.

7. The arrangement according to claim 5, wherein each of the circuit boards is set up to supply two components of the server insert with power and wherein all components are configured to be supplied by one or more of the power supply units of the server insert by means of both lines.

8. The arrangement according to claim 6, comprising two of the power supply units of the server insert, wherein the two power supply units of the server insert each belong to one of the circuit boards respectively and each is set up to supply power to the components connected with the one of the circuit boards respectively and, auxiliary, to supply power to components connected with the other one of the circuit boards via the lines and the associated other one of the circuit boards respectively.

9. The arrangement according to claim 7, comprising two of the power supply units of the server insert, wherein the two power supply units of the server insert each belong to one of the circuit boards respectively and each is set up to supply power to the components connected with the one of the circuit boards respectively and, auxiliary, to supply power to components connected with the other one of the circuit boards via the lines and the associated other one of the circuit boards respectively.

10. The arrangement according to claim 3, wherein the two circuit boards are spaced apart in such a way as to allow an assembly of the server insert to be arranged between the two circuit boards.

11. The arrangement according to claim 4, wherein the two circuit boards are spaced apart in such a way as to allow an assembly of the server insert to be arranged between the two circuit boards.

12. The arrangement according to claim 10, wherein the assembly comprises ventilators for the server insert, which are configured to be supplied with energy via further contacts on the circuit boards.

13. The arrangement according to claim 11, wherein the assembly comprises ventilators for the server insert, which are configured to be supplied with energy via further contacts on the circuit boards.

14. A server insert with an arrangement comprising
two lines for a server insert for connecting a power supply unit of the server insert to a circuit board,
wherein each of the two lines comprises a first current rail and a second current rail, wherein on each of the two lines the first current rail and the second current rail are arranged parallel to each other and are configured to be secured on the power supply unit of the server insert and the circuit board,
wherein the current rails have first connection elements, which are arranged in such a way that the two lines are connectable with each other to form a point-symmetrical arrangement of the two lines, and
wherein the two lines are interconnected with the first connection elements and are arranged in a point-symmetrical manner, and wherein on each of the two lines at least one plug connector is connected to the first current rail and at least one plug connector is connected to the second current rail, wherein the plug connecters are each connectable to the power supply unit of the server insert,
at least one power supply unit of the server insert, which is mechanically and electrically connected to one of the two lines,
two circuit boards including the circuit board and another circuit board, the two circuit boards having distributor contacts, and each of the two lines being mechanically and electrically connected with one of the two circuit boards.

15. The server insert according to claim 14, wherein the current rails have second connection elements, and the current rails are secured with the second connection elements on the respective circuit boards with the distributor contacts.

16. The server insert according to claim 14, comprising at least two of the power supply units of the server insert, each of which is mechanically and electrically connected to one of the lines.

17. The server insert according to claim 14, wherein the two circuit boards are spaced apart in such a way as to allow an assembly of the server insert to be arranged between the two circuit boards.

* * * * *